US010170473B1

(12) United States Patent
Zang et al.

(10) Patent No.: US 10,170,473 B1
(45) Date of Patent: Jan. 1, 2019

(54) FORMING LONG CHANNEL FINFET WITH SHORT CHANNEL VERTICAL FINFET AND RELATED INTEGRATED CIRCUIT

(71) Applicant: GLOBALFOUNDRIES INC., Grand Cayman (KY)

(72) Inventors: Hui Zang, Guilderland, NY (US); Josef S. Watts, Stillwater, NY (US); Yi Qi, Niskayuna, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/811,745

(22) Filed: Nov. 14, 2017

(51) Int. Cl.
| | |
|---|---|
| *H01L 27/088* | (2006.01) |
| *H01L 29/08* | (2006.01) |
| *H01L 29/10* | (2006.01) |
| *H01L 29/78* | (2006.01) |
| *H01L 21/8234* | (2006.01) |
| *H01L 27/02* | (2006.01) |
| *H01L 21/266* | (2006.01) |

(Continued)

(52) U.S. Cl.
CPC ........ *H01L 27/0886* (2013.01); *H01L 21/266* (2013.01); *H01L 21/823418* (2013.01); *H01L 21/823431* (2013.01); *H01L 21/823437* (2013.01); *H01L 21/823468* (2013.01); *H01L 21/823487* (2013.01); *H01L 27/0207* (2013.01); *H01L 29/0692* (2013.01); *H01L 29/0847* (2013.01); *H01L 29/1037* (2013.01); *H01L 29/6656* (2013.01); *H01L 29/66666* (2013.01); *H01L 29/7827* (2013.01)

(58) Field of Classification Search
CPC ............... H01L 27/0886; H01L 21/266; H01L 21/823418; H01L 21/823431; H01L 21/823437; H01L 21/823468; H01L 21/823487; H01L 27/0207; H01L 29/0847; H01L 29/1037; H01L 29/6656; H01L 29/66666; H01L 29/7827; H01L 27/11582; H01L 29/4238; H01L 29/42376; H01L 29/42392
See application file for complete search history.

(56) References Cited

U.S. PATENT DOCUMENTS

| | | | | |
|---|---|---|---|---|
| 9,067,899 | B2 * | 6/2015 | Berg | .......... C07D 275/04 |
| 2016/0211369 | A1 * | 7/2016 | Jan | ............ H01L 27/12 |
| 2018/0053843 | A1 * | 2/2018 | Anderson | ...... H01L 29/7827 |

* cited by examiner

*Primary Examiner* — Shahed Ahmed
(74) *Attorney, Agent, or Firm* — Yuanmin Cai; Hoffman Warnick LLC

(57) ABSTRACT

A method of forming an integrated circuit includes forming a FinFET by: forming a semiconductor fin on a semiconductor substrate; forming a first source/drain region in the semiconductor substrate under a first end of the semiconductor fin and a second source/drain region in the semiconductor substrate under a second, opposing end of the semiconductor fin, the second source/drain region separated from the first source/drain region by a portion of the semiconductor substrate having an opposite doping from that of the first and second source/drain region; and forming a surrounding gate extending about the semiconductor fin above the semiconductor substrate. A second vertical FinFET may be formed simultaneously. The method allows the FinFET to have a long channel extending laterally through its fin compared to the short channel of the vertical FinFET, thus creating short channel and long channel devices together without impacting vertical FinFET height.

9 Claims, 14 Drawing Sheets

(51) Int. Cl.
*H01L 29/66* (2006.01)
*H01L 29/06* (2006.01)

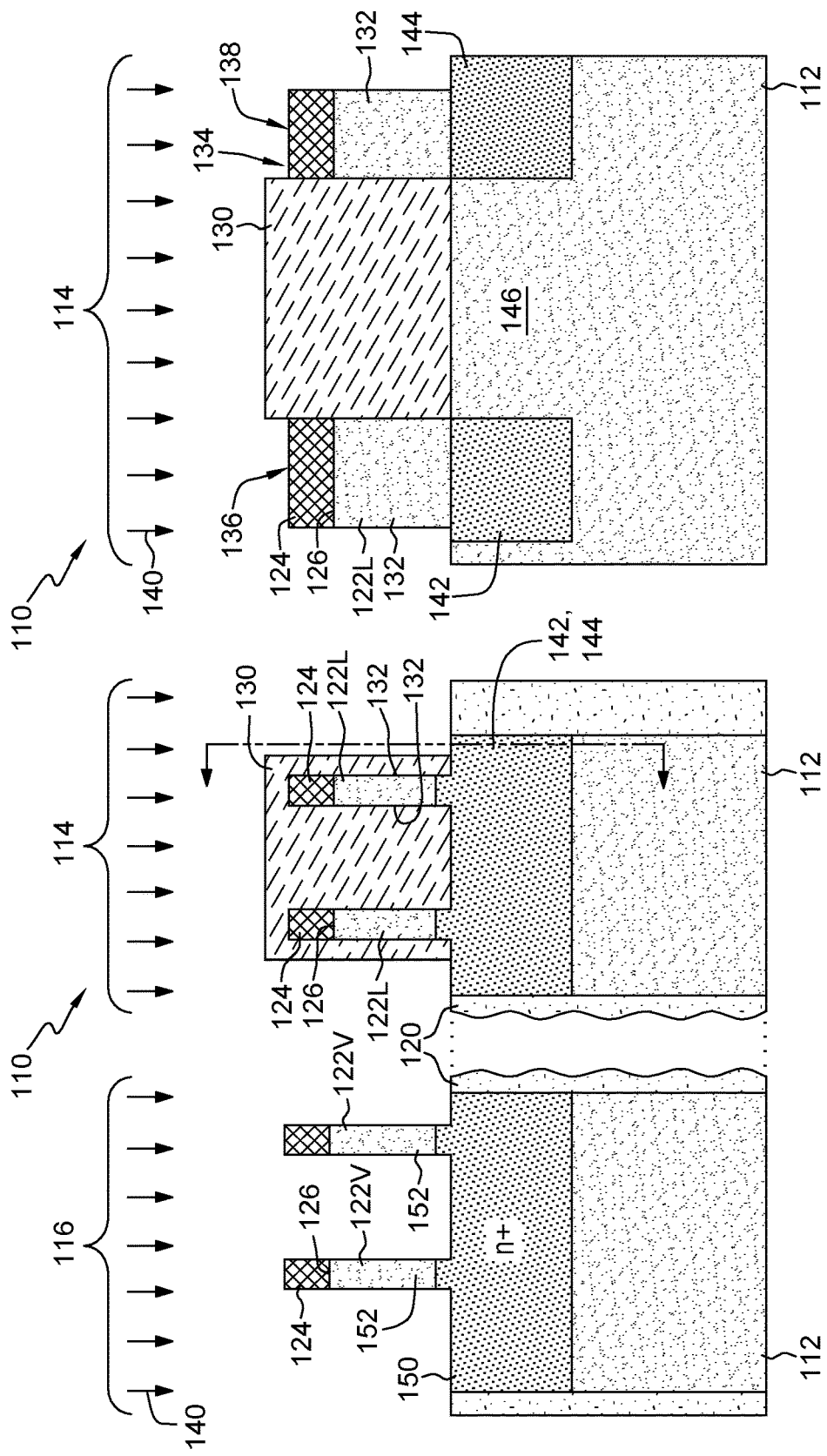

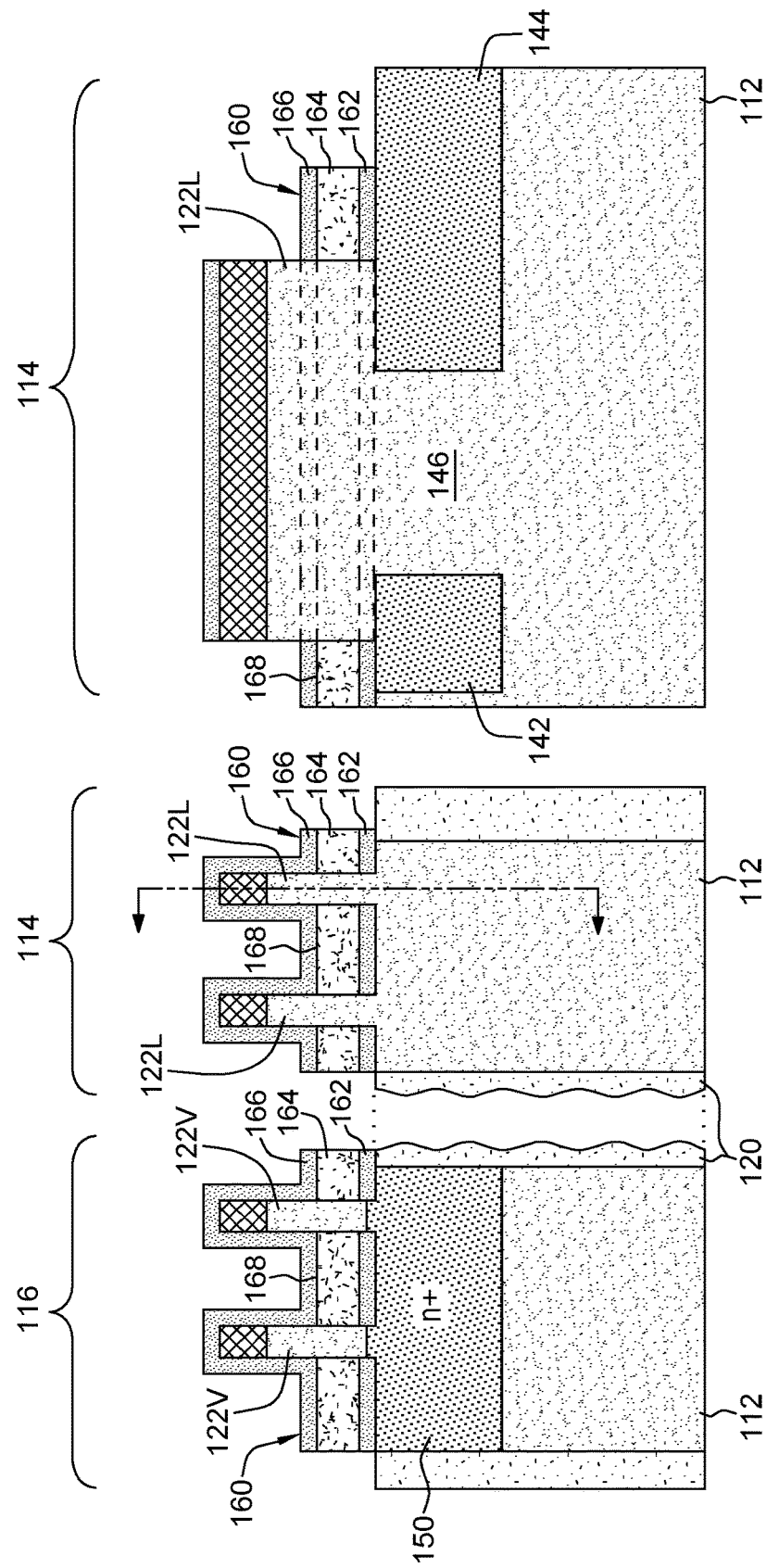

US 10,170,473 B1

FORMING LONG CHANNEL FINFET WITH SHORT CHANNEL VERTICAL FINFET AND RELATED INTEGRATED CIRCUIT

BACKGROUND

The present disclosure relates to integrated circuit (IC) fabrication, and more specifically, to an IC including a long channel fin-type field effect transistor (FinFET) having source/drain regions below a semiconductor fin in a semiconductor substrate. Methods of forming the IC are compatible with simultaneously forming a vertical FinFET.

In integrated circuits, fin-type field effect transistors are used widely to create various devices. With conventional FinFETs, source/drain regions are formed in a semiconductor fin, e.g., by implanting dopants, and a gate is created over or against the fin. The area of the fin within the gate creates a channel for the transistor structure. When the gate is active, current travels laterally through the fin between the source/drain regions therein. One can adjust channel length by adjusting the distance between the source/drain regions in the fin. Controlling channel length controls a number of performance factors for a transistor structure such as current leakage, threshold voltage, responsiveness, reliability, etc.

Vertical FinFETs include a semiconductor fin with one source/drain region formed below the fin, and another source/drain region formed atop the fin, and a gate formed about the semiconductor fin. A channel is formed within the gate in the fin. When the gate is active, current travels vertically within the fin between the source/drain regions. Vertical FinFETs are the desired structure for the 5 nanometer technology node and beyond because they allow scaling of the source/drain regions and channel within the same areal footprint, i.e., because they are vertically arranged.

One challenge with vertical FinFETs is creating a long channel device with other vertical FinFETs. In particular, forming a long channel device requires increasing fin height, which raises the overall height of the transistor structure in such a way that it may not be compatible with other vertical FinFETs within the integrated circuit. One approach to address this challenge, shown in FIG. 1, includes creating a laterally long channel bulk FET 10 with vertical FinFETs 12. Vertical FinFETs 12 include a lower source/drain region 14 in semiconductor substrate 16, a semiconductor fin(s) 18 extending from semiconductor substrate 16 and an upper source/drain region 20 over semiconductor fin(s) 18, e.g., epitaxially grown. A gate 22 including an upper spacer 24 and a lower spacer 26 surrounds semiconductor fin(s) 18. On the far right side, a long channel FET 10 is shown. Here, a lower spacer (26 on left) is removed, and a lower source/drain region 32 is moved laterally within substrate 16 from under a gate 34. A conventional gate dielectric 35 may be used between gate 34 and other structure. In any event, long, cornered channel 36 (path with arrows) is formed from upper source/drain region 38 through semiconductor fin 40, through semiconductor substrate 16 to lower source/drain region 32. This arrangement suffers from a number of issues. First, etching to remove lower spacer (26 on left) (see enlarged area) creates a surface roughness and curved surface 42 in the etch direction, which makes control of the length of cornered channel 36 very difficult. The long cornered channel 36 also creates reliability concerns for input/output devices due to the corner, and a double channel (fin 38 and substrate 16) in series results in poor device performance. Further, this process requires an additional masking step to protect other structure during removal of the lower spacer (26 on left) for the long channel FET 10.

Another approach is shown in FIG. 2. In this approach, a long channel device 50 uses a pair of fins 52, 54 to contact a long channel bulk FET 60 (arrows). Vertical FinFETs 12 are identical to those described relative to FIG. 1. Here, source/drain regions 56, 58 are formed on top of each fin 52, 54 and a lower spacer (26 on left) is removed therebetween, creating a channel 60 that is U-shaped. Gate 62 surrounds both fins 52, 54. A conventional gate dielectric 55 may be used between gate 62 and bulk channel. The formation process for this type long channel device 50 suffers from the same shortcomings as that of the arrangement of FIG. 1.

It is very difficult to create a long channel device, or long channel input/output device, with vertical FinFETs.

SUMMARY

A first aspect of the disclosure is directed to an integrated circuit (IC), comprising: a first transistor structure including: a semiconductor substrate; a semiconductor fin extending from the semiconductor substrate; a doped first source/drain region in the semiconductor substrate under a first end of the semiconductor fin; a doped second source/drain region in the semiconductor substrate under a second, opposing end of the semiconductor fin, the second source/drain region separated from the first source/drain region by a portion of the semiconductor substrate with opposite doping from that of the first and second source/drain region; and a surrounding gate extending about the semiconductor fin above the semiconductor substrate, a lower surface of the surrounding gate isolated from the semiconductor substrate by a first spacer.

A second aspect of the disclosure includes a method of forming an integrated circuit, the method comprising: forming a first transistor structure by: forming a semiconductor fin on a semiconductor substrate; forming a doped first source/drain region in the semiconductor substrate under a first end of the semiconductor fin and a doped second source/drain region in the semiconductor substrate under a second, opposing end of the semiconductor fin, the second source/drain region separated from the first source/drain region by a portion of the semiconductor substrate having an opposite doping from that of the first and second source/drain region; and forming a surrounding gate extending about the semiconductor fin above the semiconductor substrate, the surrounding gate isolated from the semiconductor substrate by a first spacer.

A third aspect of the disclosure related to a method of forming an integrated circuit, the method comprising: forming a first semiconductor fin on a semiconductor substrate and a second semiconductor fin on the semiconductor substrate, each semiconductor fin having a first mask over an upper surface thereof; forming a second mask covering the first mask and sidewalls of the first semiconductor fin in a center portion of the first semiconductor fin, but leaving first and second opposing ends of the first mask and the first semiconductor fin exposed and leaving the second semiconductor fin exposed; doping to form: a first source/drain region in the semiconductor substrate under a first end of the first semiconductor fin, a second source/drain region in the semiconductor substrate under a second, opposing end of the first semiconductor fin, and a third source/drain region under a lower end of the second semiconductor fin in the semiconductor substrate, wherein the second source/drain region is separated from the first source/drain region by a portion of the semiconductor substrate having an opposite doping from that of the first and second source/drain region; removing the second mask; forming a surrounding gate extending about each of the first semiconductor fin and the second semiconductor fin above the semiconductor substrate, each surrounding gate including a lower spacer below a lower surface thereof to isolate each gate from the semiconductor substrate; and forming a fourth source/drain region on an upper end of the second semiconductor fin, wherein a first channel region in the first semiconductor fin between the first and second source/drain regions is larger than a second channel region in the second semiconductor fin between the third and fourth source/drain regions.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 3A-3B show cross-sectional views of a preliminary structure undergoing a method according to embodiments of the disclosure.

FIGS. 4A-4B show cross-sectional views of a preliminary structure undergoing a method according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide an integrated circuit (IC) and related methods that provide a long channel transistor structure that has process compatibility with vertical FinFET technology. Rather than having source/drain regions above and below the fin as in a vertical FinFET and trying to create a longer channel by manipulating the shape of the channel, embodiments of the disclosure position source/drain regions in the substrate below the fin, and provide a long channel extending laterally through the fin. Methods of formation of the long channel transistor structure remove the need to etch away the lower spacer, thus avoiding the challenges created by surface roughness and a corner channel. As will be described, the method also provides an easy mechanism to control channel length and improve reliability without adding mask steps.

Figure 5A:
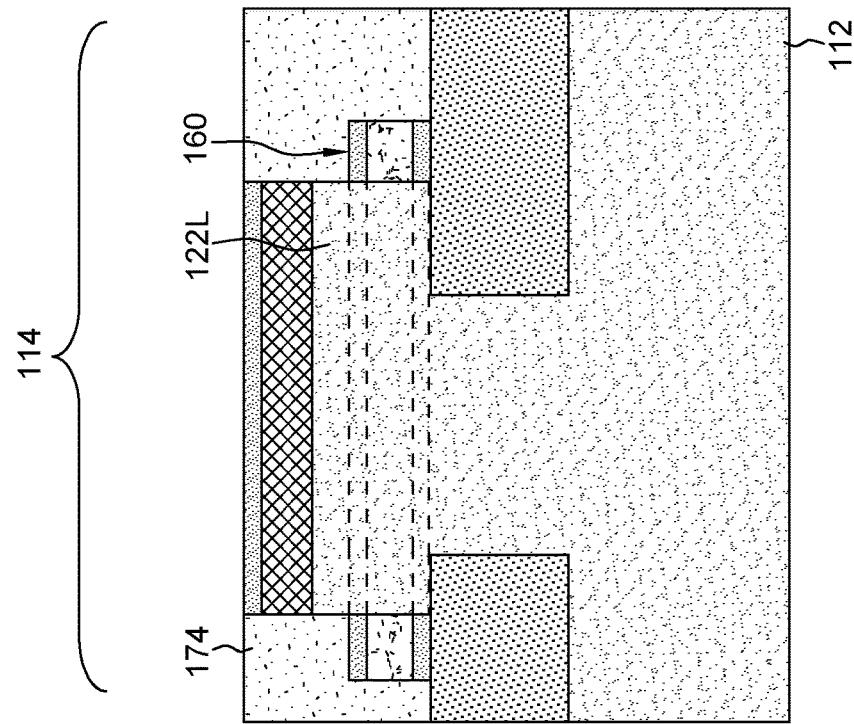
FIGS. 5A-5B show cross-sectional views of a preliminary structure undergoing a method according to embodiments of the disclosure.
Figure 5B:
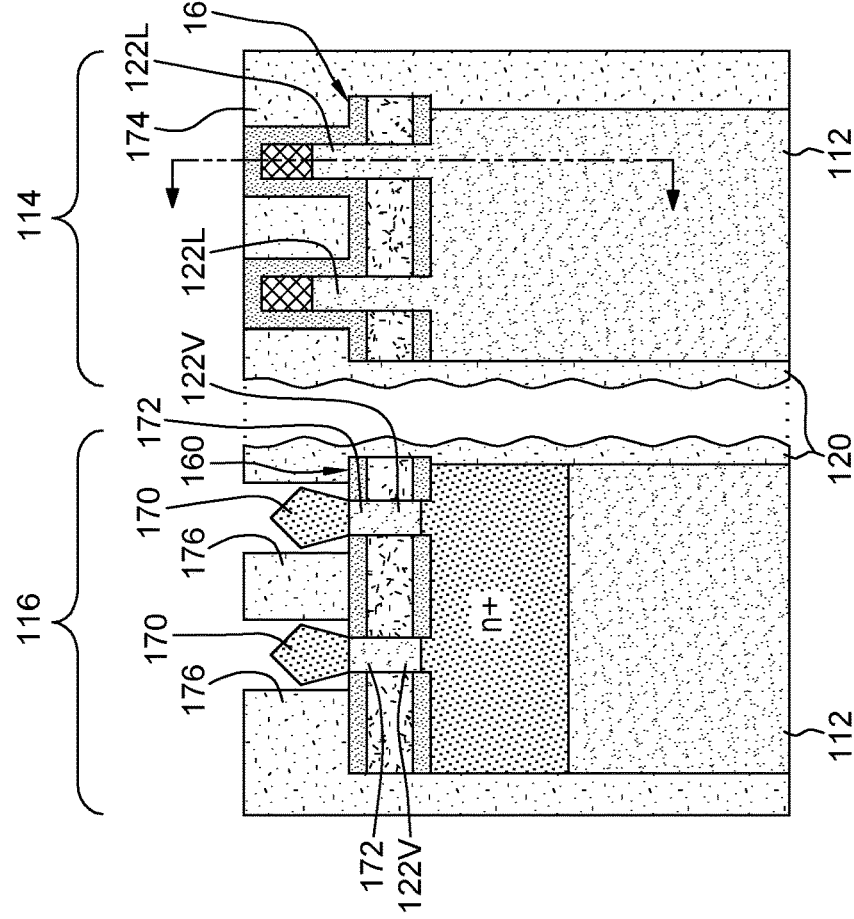
Figures 6A, 6B:
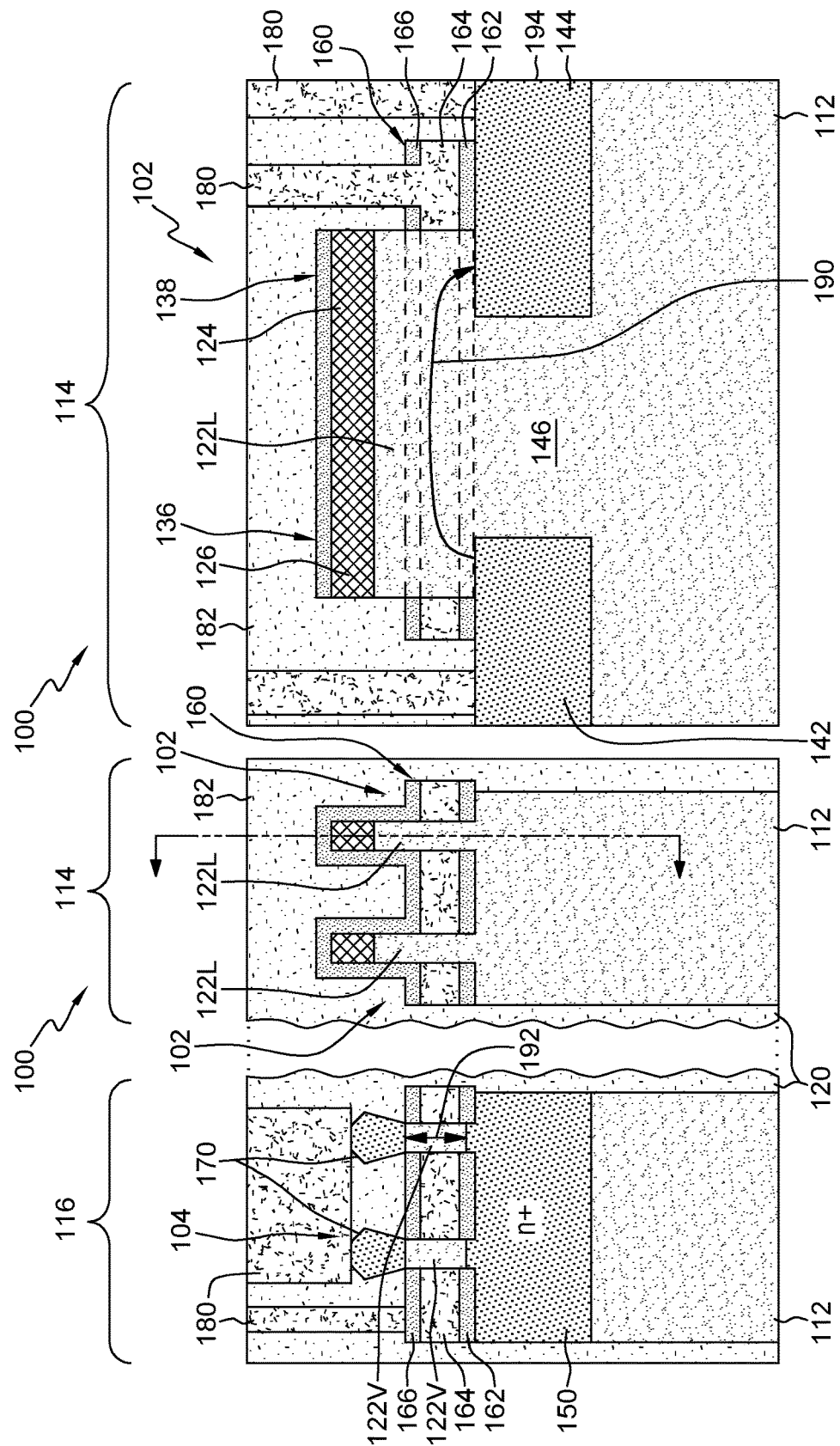
FIGS. 6A-6B show cross-sectional views of a long channel FinFET with a vertical FinFET, according to embodiments of the disclosure

Referring to FIGS. 3A-6B, embodiments of a method of forming an integrated circuit (IC) 100 (FIGS. 6A-6B) are shown. As will be described in greater detail herein, embodiments of IC 100 may include a long channel fin-type field effect transistor (FinFET) 102 (first transistor structure) alone, or with vertical FinFETs 104 (second transistor structure). FIGS. 6A-6B show IC 100 according to embodiments of the disclosure, as will be described in greater detail herein. In the drawings, those figures labeled 'A', such as FIG. 3A, show a first cross-sectional view across a width of semiconductor fins of the FinFETs, and those figures labeled 'B', such as FIG. 3B, show a second cross-sectional lengthwise along a semiconductor fin of a long channel FinFET 102, during fabrication thereof.

FIGS. 3A-3B show a preliminary structure 110 including previously formed structure for the methods of fabrication. Preliminary structure 110 may include a semiconductor substrate 112, which may be segmented into a first area 114 for long channel FinFETs 102 (FIGS. 6A-6B) and a second area 116 for vertical FinFETs 104 (FIGS. 6A-6B). Semiconductor substrate 112 may be segmented into different areas, e.g., by shallow trench isolations (STI) 120 (FIG. 3A). STI 120 may be formed by etching a trench (not numbered) into semiconductor substrate 112 and filling it with an insulating material such as oxide, to isolate one region of the substrate from an adjacent region of the substrate. One or more transistors of a given polarity may be disposed within an area 114, 116 or other area, isolated by STI.

Semiconductor substrate 112 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 112 may be strained.

One embodiment of a method of forming IC 100 (FIGS. 6A-6B) may include forming a first transistor structure, i.e., long channel FinFET 102, alone. Another embodiment of a method of forming IC 100 may include forming FinFET 102 at least partially simultaneously with a second transistor structure, i.e., vertical FinFET 104. In any event, methods may include forming a semiconductor fin(s) 122 on semiconductor substrate 112. For purposes of description, semiconductor fins for long channel FinFET(s) 102 (FIGS. 6A-6B) will be referenced by numeral 122L, semiconductor fins for vertical FinFET(s) 104 will be referenced with numeral 122V, and semiconductor fins will be collectively referenced with numeral 122. As shown, each area 114, 116 includes a pair of semiconductor fins 122V or 122L, it is understood that any number of fins may be employed within each area and a number of fins may be used within each FinFET 102, 104, resulting from embodiments of the methods.

Semiconductor fin(s) 122 may be formed using any now known or later developed technique. For example, semiconductor fins 122 may be formed by creating a patterned positive hard mask 124 over semiconductor substrate 112 and etching to form the fins. In this case, mask 124 may be formed using any now known or later developed processing. For example, mask 124 may be deposited, then patterned and etched. Alternatively, semiconductor fins 122 may be formed by forming a patterned negative mask (not shown) with openings therein exposing semiconductor substrate 112 and epitaxially growing the fins from the substrate. In the latter case, mask 124 may be added subsequently, if needed, to fin formation. In any event, as shown in FIGS. 3A-3B, hard mask 124 extends over an upper surface 126 of semiconductor fin(s) 122, i.e., to protect fin(s) 122 during subsequent processing and to isolate fin(s) 122 from other structure of the final product. Mask 124 may include any now known or later developed hard mask material such as but not limited to silicon nitride, silicon dioxide, or carbon.

As used herein, etching generally refers to the removal of material from a substrate (or structures formed on the substrate), and is often performed with a mask in place so that material may selectively be removed from certain areas of the substrate, while leaving the material unaffected, in other areas of the substrate covered by the mask. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Fins 122 and mask 124 may be formed using any appropriate etching chemistry(ies) for mask 124 and semiconductor substrate 112, e.g., a RIE chemistry.

The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. In some embodiments, epitaxial growth processes may be selective to forming on semiconductor surfaces, and may not deposit material on dielectric surfaces, such as silicon dioxide or silicon nitride surfaces.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
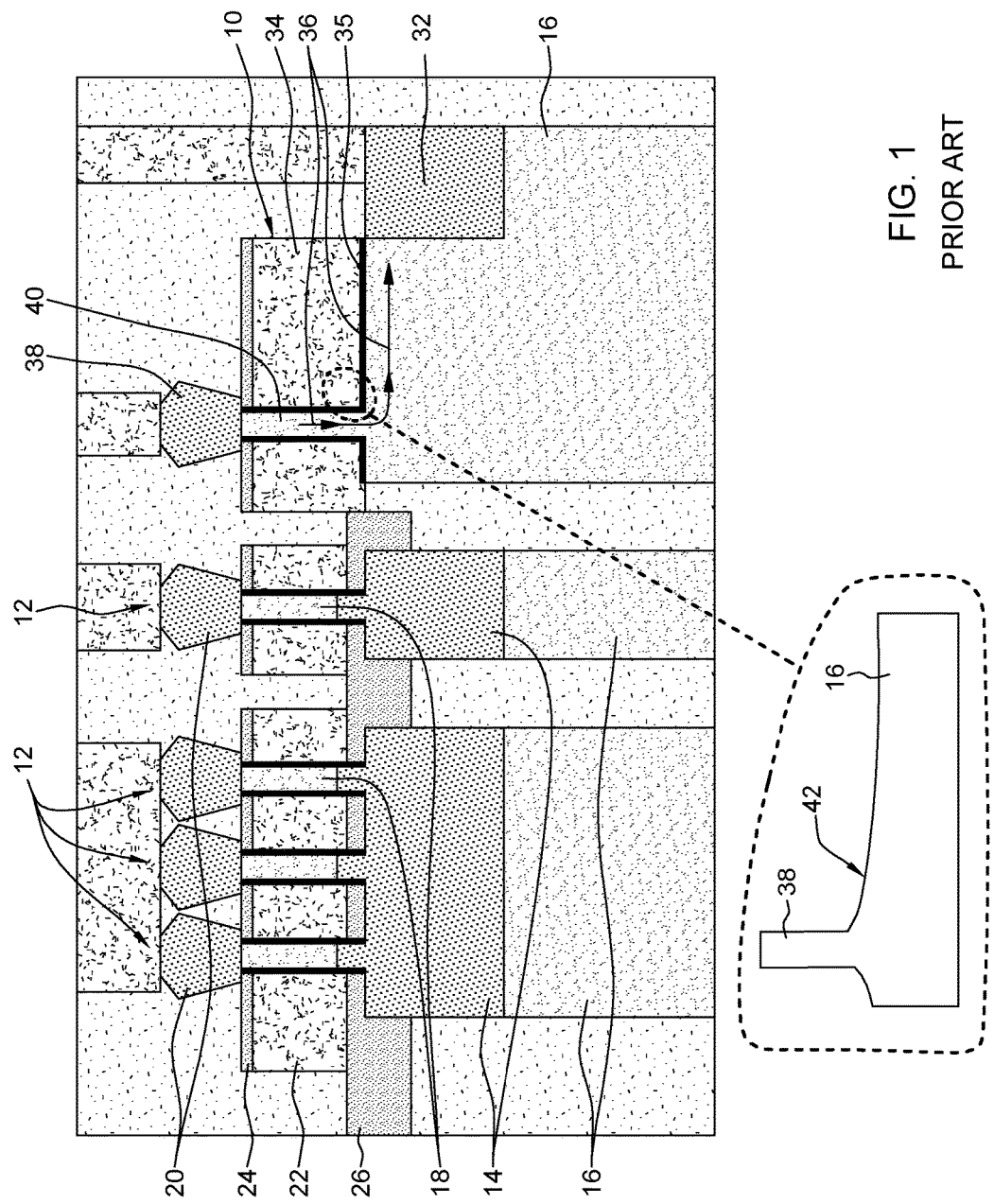
FIG. 1 shows a conventional approach to forming long channel FinFETs with vertical FinFETs.
Figure 2:
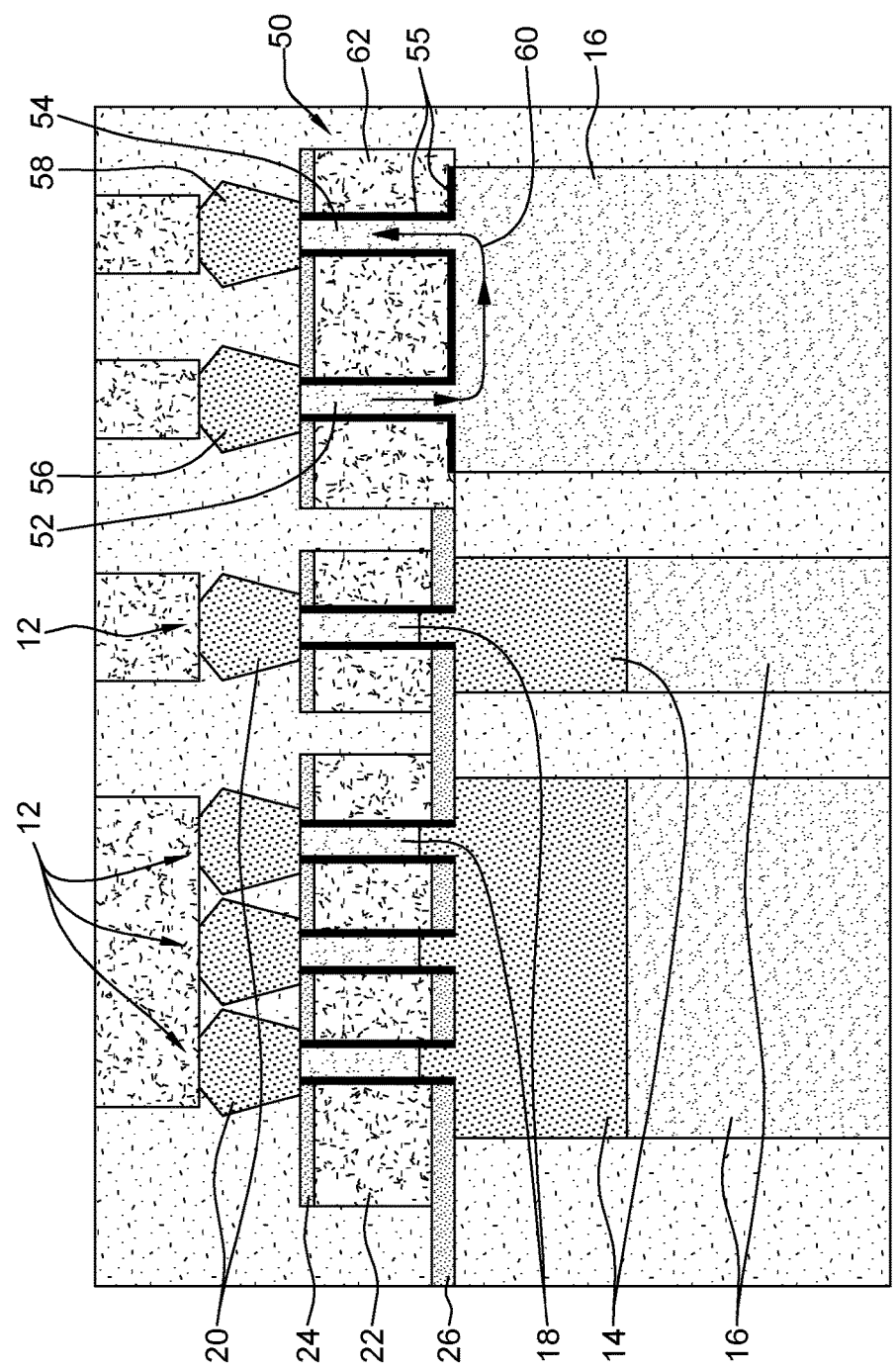
FIG. 2 shows another conventional approach to forming long channel FinFETs with vertical FinFETs.
Figure 3C:
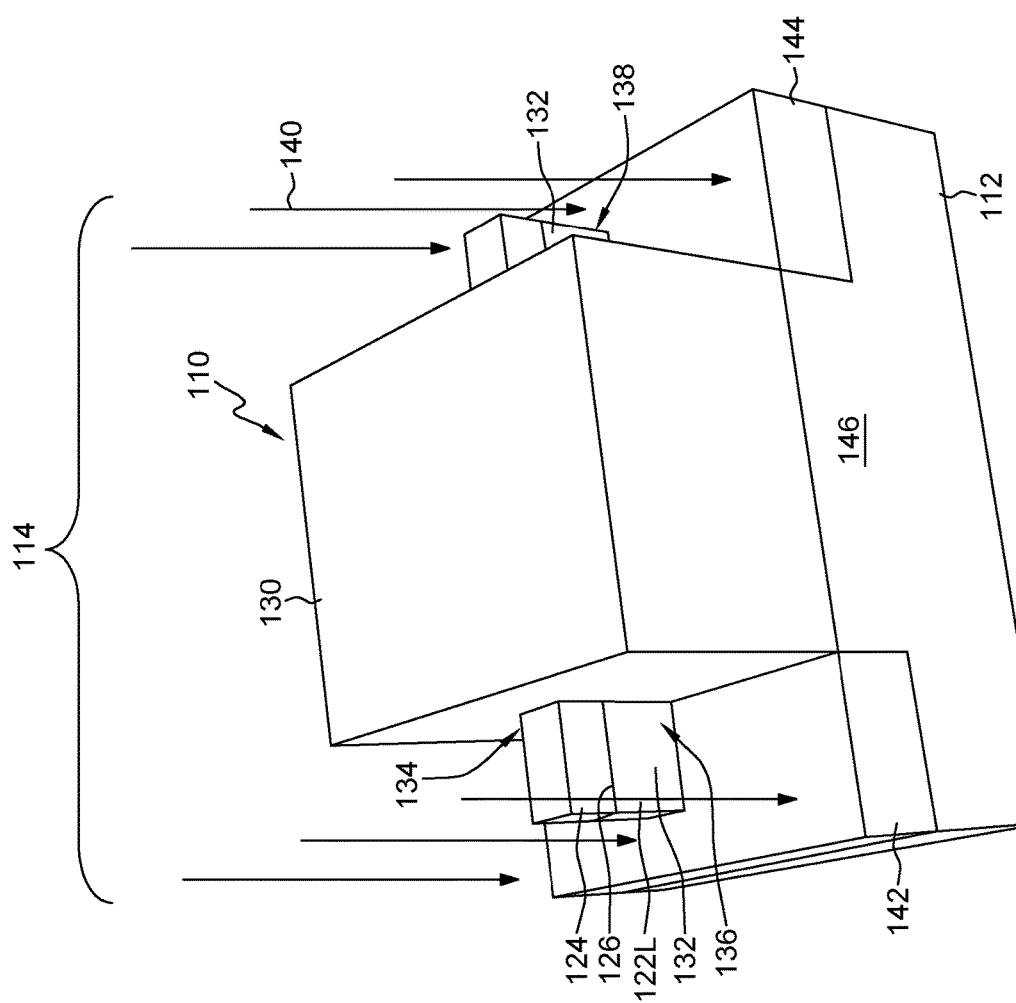
FIG. 3C shows a perspective view of the preliminary structure of FIG. 3B.

FIGS. 3A-B and FIG. 3C also show forming various source/drain regions according to embodiments of the disclosure. The cross-section of FIG. 3A, right side, is taken through source/drain regions 144 in FIG. 3B viewing to the left. FIG. 3C shows a perspective view. Each source/drain region may be formed using doping processes. Doping is the process of introducing impurities (dopants) into semiconductor substrate 112, or elements formed on the semiconductor substrate (e.g., fin(s) 122). An ion implanter (not shown) is typically employed for the actual implantation. An inert carrier gas such as nitrogen is usually used to bring in the impurity source (dopant). Dopants take different forms referred to as n-type and p-type, depending on the type of FinFET desired. N-type dopants may include but are not limited to: phosphorous (P), arsenic (As), antimony (Sb). N-type is element introduced to semiconductor to generate free electron (by "donating" electron to semiconductor). P-type dopants may include but are not limited to: boron (B), indium (In) and gallium (Ga). P-type is an element introduced to semiconductor to generate free hole (by "accepting" electron from semiconductor atom and "releasing" hole at the same time). In the example shown, all of the source/drain regions are n-type doped, so as to create n-type FinFETs in areas 114, 116. It is understood that p-type dopants may also be employed.

As understood in the field, during doping, typically a mask is formed over area(s) (not shown) of preliminary structure 110 that are not to have their source/drain regions doped with the selected dopant (e.g., an n-type dopant) while other areas, e.g., areas 114, 116, are left unexposed and have source/drain regions formed by the doping. That is, a mask is formed so that only certain areas, i.e., 114, 116, of semiconductor substrate 112 will be doped. Later, the mask may be removed and another mask may be formed over areas 114, 116 so that another type of dopant, e.g., p-type dopant, can be used to form source/drain regions in other areas (not shown).

In contrast to conventional processing, embodiments of the disclosure form a mask 130 covering part of semiconductor fin 122L for long channel FinFET 102 in area 114. As shown in FIGS. 3B and 3C, mask 130 covers a center portion 134 of semiconductor fin 122L but leaves first end 136 and second opposing end 138 of mask 124 and semiconductor fin 122L exposed. That is, mask 124 and sidewalls 132 of semiconductor fin 122L are exposed at ends 136, 138 by mask 130, but mask 124 and sidewalls 132 are covered in center portion 134. The extent of first end 136 and second opposing end 138 exposed may vary, e.g., based on voltage and current capacity the FET is designed for. Mask 130 also leaves semiconductor fin(s) 122V and mask 124 thereover, exposed. Mask 130 may be implemented as part of a mask that covers other areas of preliminary structure 110 that are not to be doped. In this manner, as will be described, embodiments of the disclosure can be implemented without adding another masking step. Mask 130 may include any now known or later developed hard mask material such as but not limited to silicon nitride, silicon oxide or carbon.

FIGS. 3A-C also show the results of doping 140. In particular, FIGS. 3B and 3C show doping 140 dopes semiconductor substrate 112 under first and second opposing ends 136, 138 of semiconductor fin 122L. Doping 140 thus forms a first source/drain region 142 in semiconductor substrate 122 under first end 136 of semiconductor fin 122L, and a second source/drain region 144 in semiconductor substrate 112 under second, opposing end 138 of semiconductor fin 122L. Semiconductor fin 122L is devoid of dopants for first and second source/drain regions 142, 144, i.e., implant is vertical and mask 124 shields semiconductor fin 122L. As shown in FIG. 3B, second source/drain region 144 is separated from first source/drain region 142 by a portion 146 of semiconductor substrate 112 having an opposite doping from that of first and second source/drain regions 142, 144. That is, if first and second source/drain regions 142, 144 are n-type doped, portion 146 is p-typed doped, and vice versa. Portion 146 may be so doped at any appropriate time, e.g., prior to fin 122 formation. Portion 146 thus defines an inner extent of each source/drain region 142, 144. As shown in FIG. 3A, doping 140 also may (simultaneously) form a lower source/drain region 150 under a lower end 152 of semiconductor fin 122V in semiconductor substrate 112. Hence, formation of one source/drain region 150 of vertical FinFET 104 (FIGS. 6A-B) can occur simultaneously with long channel FinFET 102 (FIGS. 6A-B) formation. As will be described herein, source/drain regions 142, 144 being positioned below semiconductor fin 122L allows for formation of a channel region 190 (FIG. 6A-B) within the fin (with a surrounding gate) in a way that allows control of channel length and gate height in a manner that is compatible with formation of vertical FinFETs 104 (FIGS. 6A-B).

As shown in FIGS. 4A-B, mask 130 (FIGS. 3A and 3B) may be removed after the doping, e.g., using any now known or later developed mask removing process such as ashing. Mask 124 remains on semiconductor fins 122. (Note, the cross-section of FIG. 4A, right side, is taken through channel 146 on FIG. 4B viewing left, while as noted, the cross-section of FIG. 3A, right side, is taken through source/drain region 144, viewing left.) Although not shown, at this point, a mask may be formed over areas 114, 116 to allow for doping of other areas of preliminary structure 110.

FIGS. 4A-4B also show forming a surrounding gate 160 extending about semiconductor fin(s) 122L above semiconductor substrate 112. (Note, the scale of FIG. 4B, right side, Surrounding gate 160 surrounds semiconductor fin(s) 122L on each vertical side thereof. Where vertical FinFETs are made simultaneously, surrounding gate 160 may also be formed extending about semiconductor fin(s) 122V. In any event, each surrounding gate 160 includes a lower spacer 162 below a lower surface thereof to isolate each gate 160 from semiconductor substrate 112. In this process, first spacer 162 may be deposited over fins 122V, 122L and over semiconductor substrate 112 and etched away from sidewalls of fins 122. The etching may include any appropriate etching chemistry(ies) for the material of first spacer 162 selective to fins 122. A gate body 164 of surrounding gate 160 may formed over first spacer 162 and about fins 122V, 122L and may include any now known or later developed gate conductor material, e.g., doped polysilicon, titanium nitride, tantalum, etc. Although not shown for clarity, it is understood that surrounding gate 160 may also include a gate dielectric layer between gate body 164 and semiconductor fins 122. The gate dielectric layer may include but is not limited to: hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. Gate 160 formation may also include forming a second spacer 166 over gate body 164, isolating an upper surface 168 of gate body 164 from other structure (to be subsequently formed). Gate body 164 and/or first spacer 162 (and/or second spacer 166) may be deposited and then etched to a desired shape in a conventional manner. The etching(s) may include any appropriate etching chemistry (ies) for spacers 162, 166 and gate body 164 material.

As observed, embodiments of the disclosure may include forming FinFET(s) 104 (FIGS. 6A-B) (left side of FIGS. 3A-5A) at least partially simultaneously with forming FinFET(s) 102 (FIGS. 6A-B) (right side of FIGS. 3A-5B). As noted, FinFETs 104 constitute vertical FinFETs, while FinFETs 102 are long channel FinFETs. After FIGS. 4A-B, vertical FinFETs 104 do not have an upper source/drain region. FIGS. 5A-B show forming an upper source/drain region 170 on an upper end 172 of semiconductor fin(s) 122V. This process may occur after an interlayer dielectric (ILD) layer 174 has been deposited over the structure of FIGS. 4A-B. ILD layer 174 may include but is not limited to: silicon nitride (Si$_3$N$_4$), silicon oxide (SiO$_2$), fluorinated SiO$_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Upper source/drain region 170 may be formed by patterning a mask (not shown) and etching openings 176 through ILD layer 174 to expose upper end 172 of semiconductor fin(s) 122V, and epitaxially growing source/drain regions 170 therefrom, i.e., in-situ doped with an n-type dopant. The etching may include any appropriate etching chemistry(ies) for ILD layer 174, e.g., a RIE.

FIGS. 6A-B show forming at least one contact 180 to each of first source/drain region 142, second source/drain region 144 and surrounding gate 160, completing a first transistor structure in the form of a long channel FinFET 102. This process may include any now known or later developed back-end-of-line (BEOL) interconnect processing, e.g., depositing another ILD layer 182, etching contact openings, depositing a liner and conductor, and planarizing. Similarly, on the left side of FIG. 6A, contacts 180 may be formed to each of lower source/drain region 150, upper source/drain region(s) 170 and surrounding gate 160, completing a second transistor structure in the form of vertical FinFET 104.

As observed best in FIG. 6B, long channel FinFET 102 has a longer channel 190 (i.e., fin 122L within gate body 164 between source/drain regions 142, 144) than a channel region 192 of vertical FinFET 104 (FIG. 6A) (i.e., within fin 122V between source/drain regions 150, 170). However, FinFET 102 does not have a different overall height than vertical FinFET 104, and the processing to form FinFET 102 is compatible with vertical FinFET 104 formation. Further, lower spacer 162 of FinFET 102 does not require etching away as in conventional approaches, thus avoiding the challenges created by surface roughness and a corner channel. Additionally, FinFET 102 channel length can be easily controlled by controlling the length of semiconductor fin 122L without adding mask steps.

Figure 7:
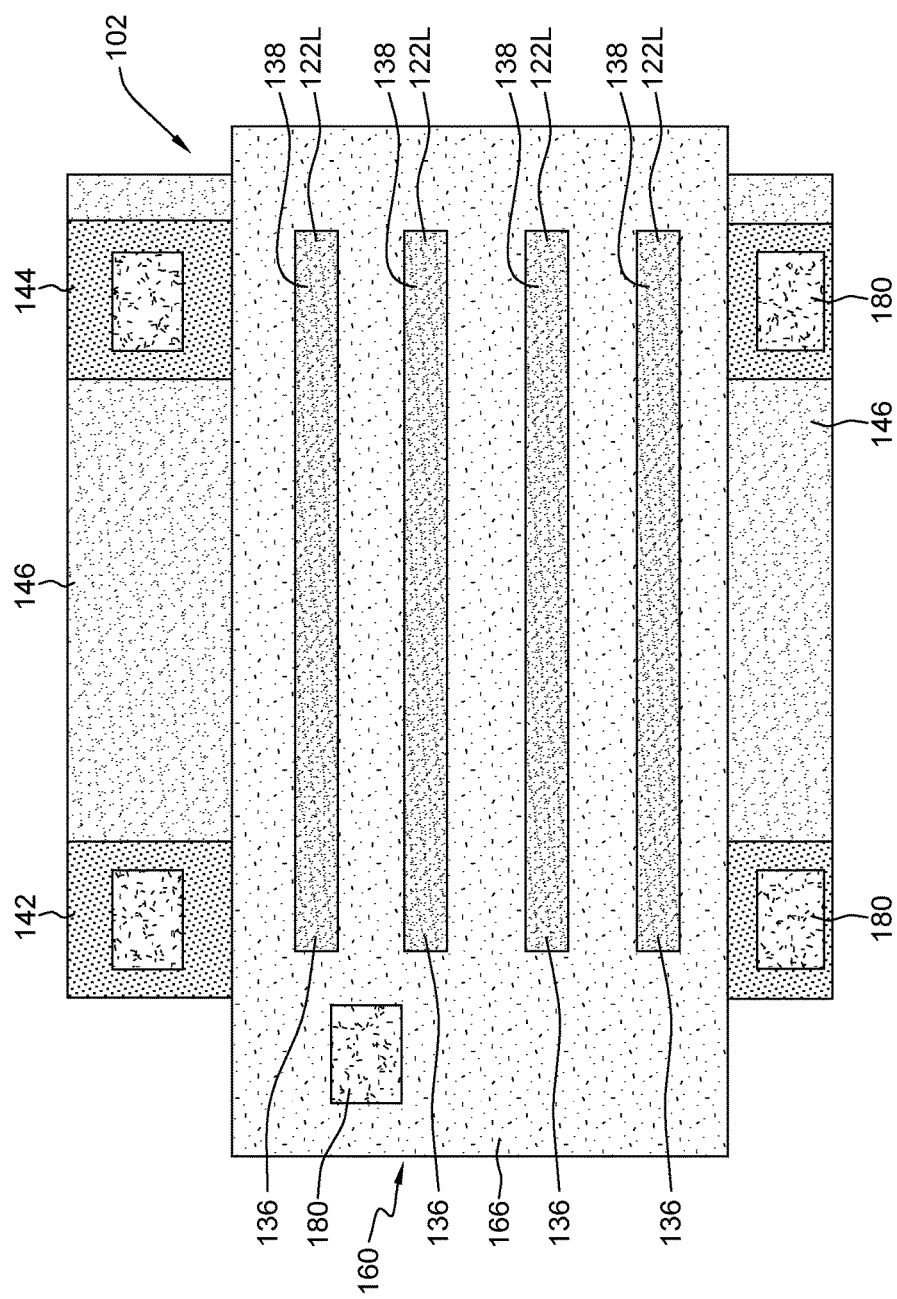
FIG. 7 shows a plan view of a long channel FinFET according to another embodiment of the disclosure.

FIGS. 6A-B also shown an IC 100 according to embodiments of the disclosure. IC 100 may include a first transistor structure, i.e., including long channel FinFET 102. IC 100 may also include vertical FinFET 104 on semiconductor substrate 112. Each FinFET 102, 104 may include semiconductor fin(s) 122 extending from semiconductor substrate 112. A hard mask 124 may be provided over upper surface 126 of semiconductor fin(s) 122. As shown in FIG. 6B, first source/drain region 142 is in semiconductor substrate 112 under first end 136 of semiconductor fin 122L, and a second source/drain region 144 is in semiconductor substrate 112 under a second, opposing end 138 of semiconductor fin 112. Second source/drain region 144 is separated from first source/drain region 142 by a portion 146 of semiconductor substrate 112 having an opposite doping from that of first and second source/drain region 142, 144. A surrounding gate 160 extends about semiconductor fin 122L above semiconductor substrate 112. A lower surface of surrounding gate 160, i.e., gate body 164, is isolated from semiconductor substrate 112 by first spacer 162. Second spacer 166 may be provided over gate body 164 isolating an upper surface 168 thereof from other structure. Semiconductor fin 122L is devoid of dopants for first and second source/drain regions 142, 144. As noted, FinFET 102 has longer channel 190 (i.e., fin 122L within gate body 164 between source/drain regions 142, 144) than channel region 192 of vertical FinFET 104 (FIG. 6A) (i.e., within fin 122V between source/drain regions 150, 170). As also noted, embodiments of the disclosure may include forming a plurality of semiconductor fins 122V and/or 122L. In this case, as shown in a top view of FIG. 7, source/drain regions 142, 144 extend under respective first end 136 and second opposing ends 138 of each semiconductor fin 122L. Surrounding gate 160 may extend about each semiconductor fin 122L (and another gate about fins 122V). As also shown in FIG. 6A, the process may be applied to multiple semiconductor fin vertical FinFETs 104, with fins 122V. IC structure 100, for FinFET 102, may also include contact(s) 180 to each of first source/drain region 142, second source/drain region 144 and surrounding gate 160. As shown in part in FIG. 6A, similar contacts 180 can be made to source/drain regions 150, 170 and surrounding gate 160 of vertical FinFET 104.

Figure 8:
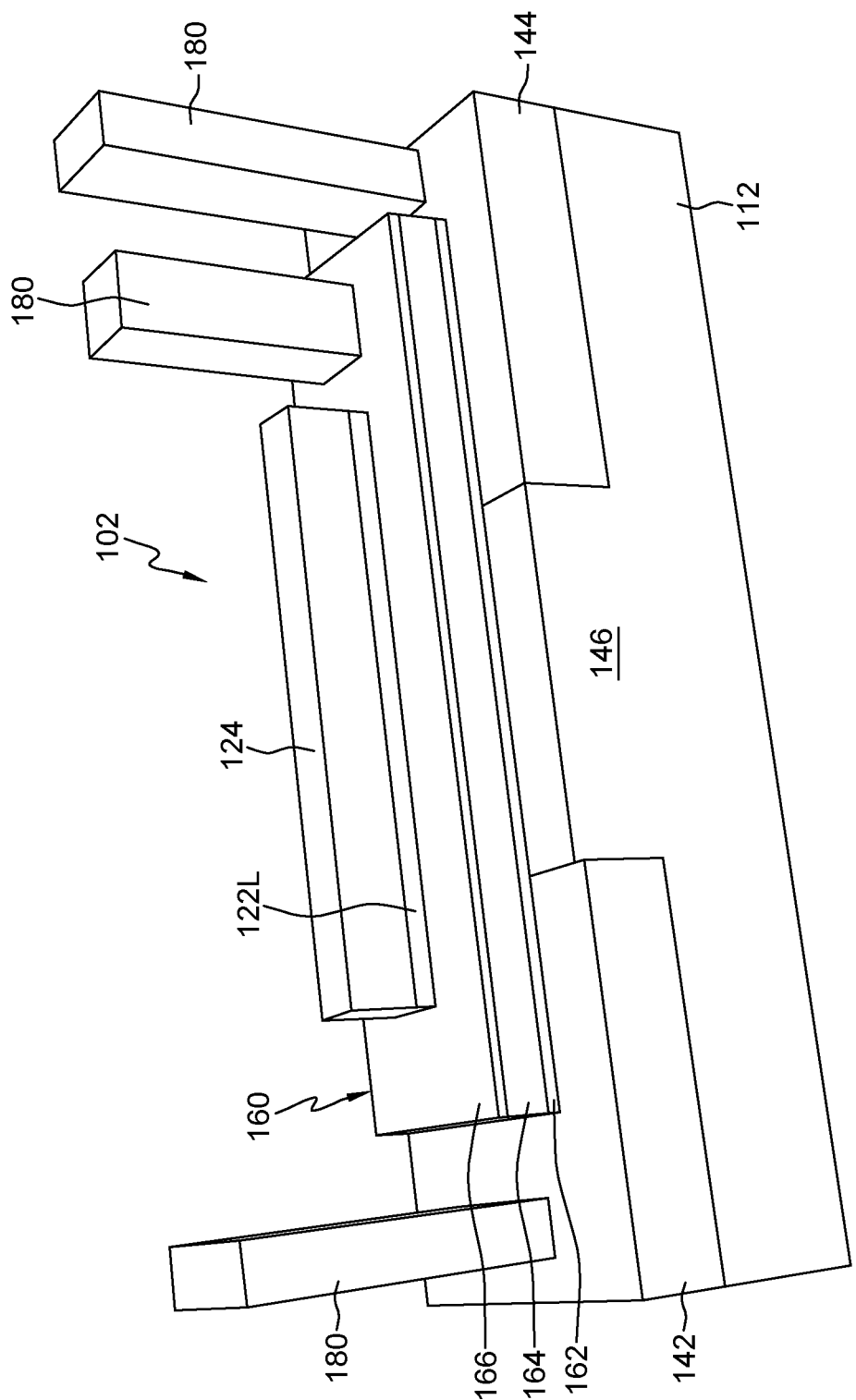
FIG. 8 shows a perspective view of a long channel FinFET according to an embodiment of the disclosure.
Figure 9:
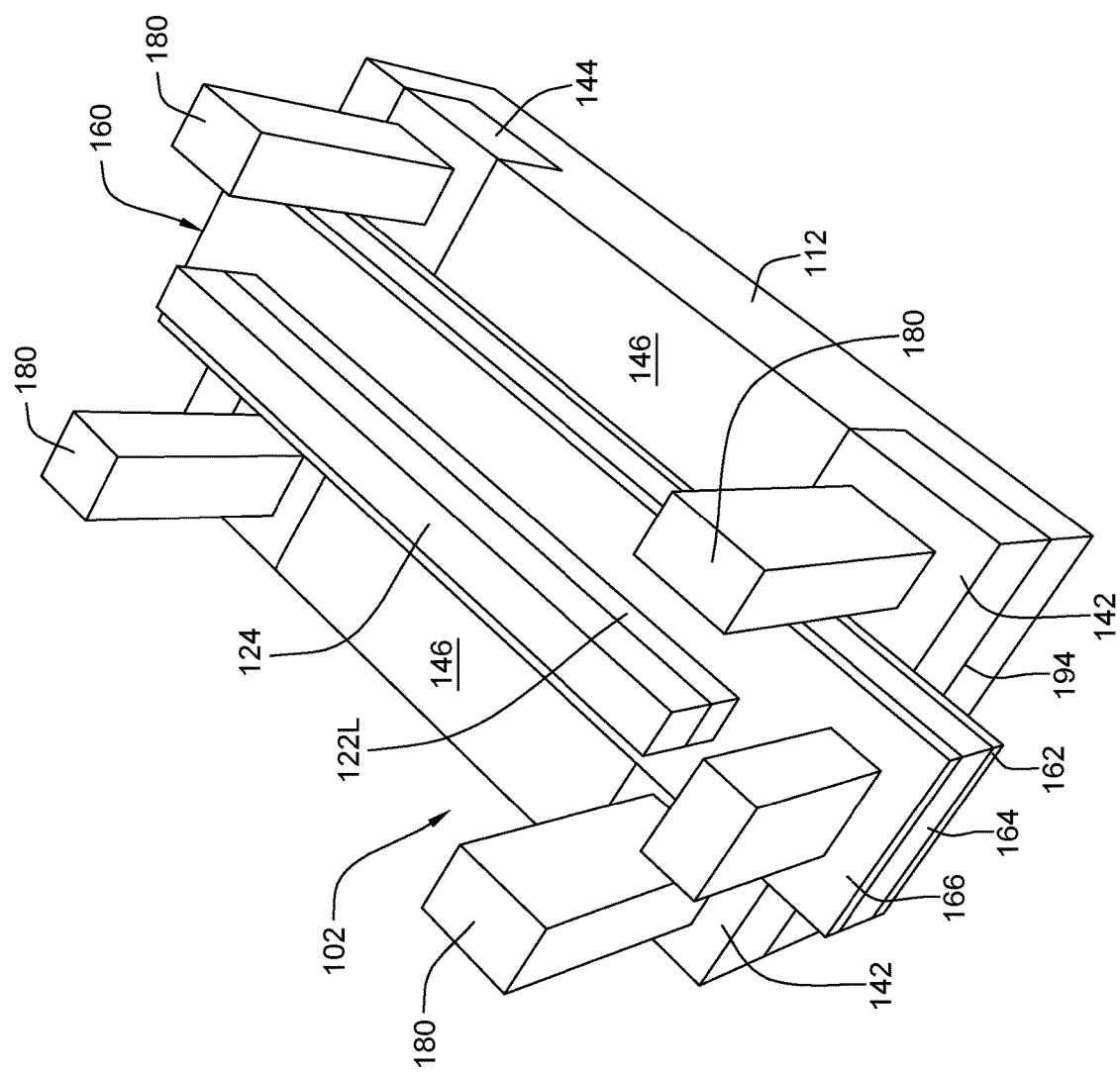
FIG. 9 shows a perspective view of a long channel FinFET according to another embodiment of the disclosure.
Figure 10:
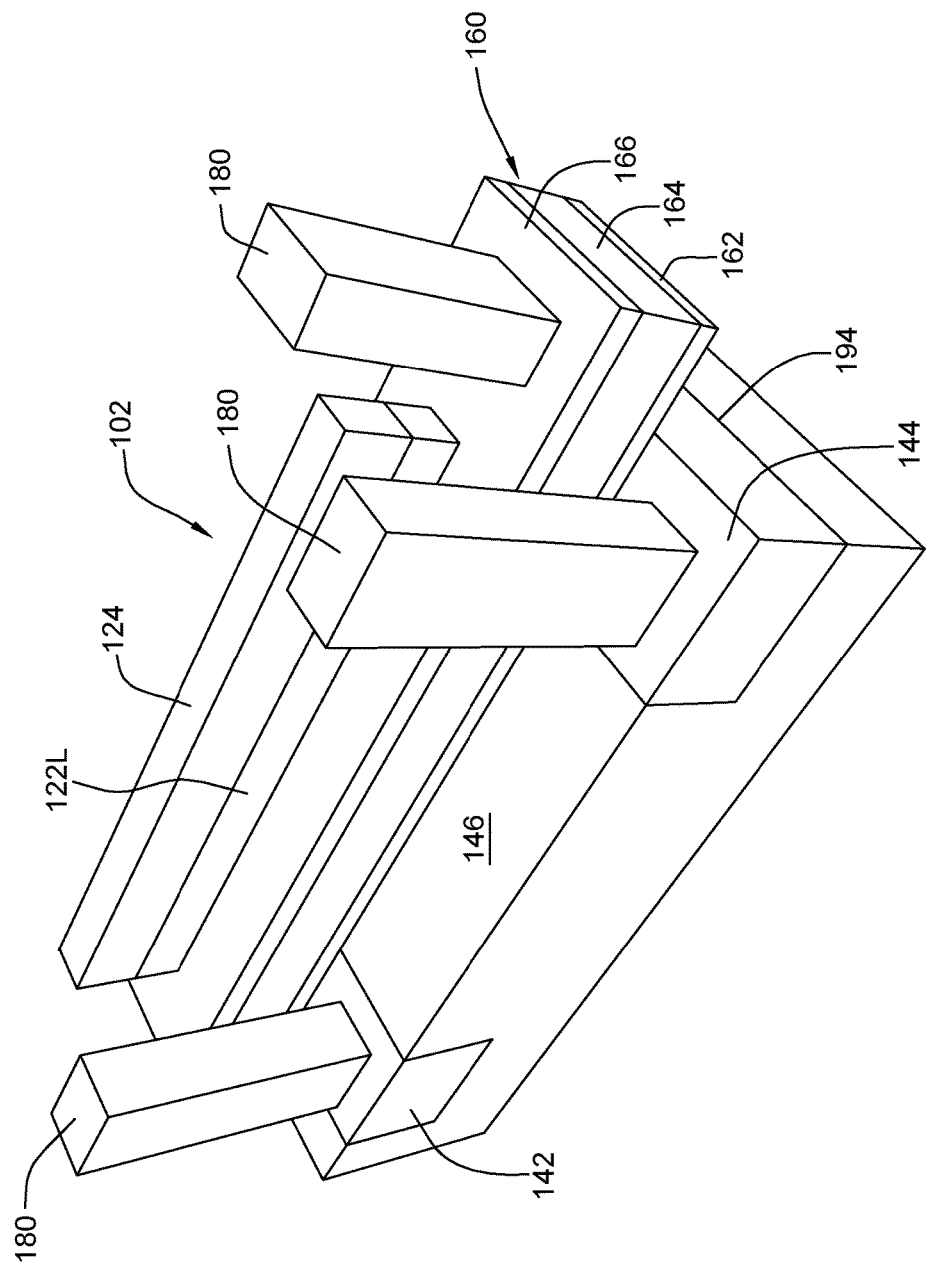
FIG. 10 shows a perspective view of a long channel FinFET according to yet another embodiment of the disclosure.
Figure 11:
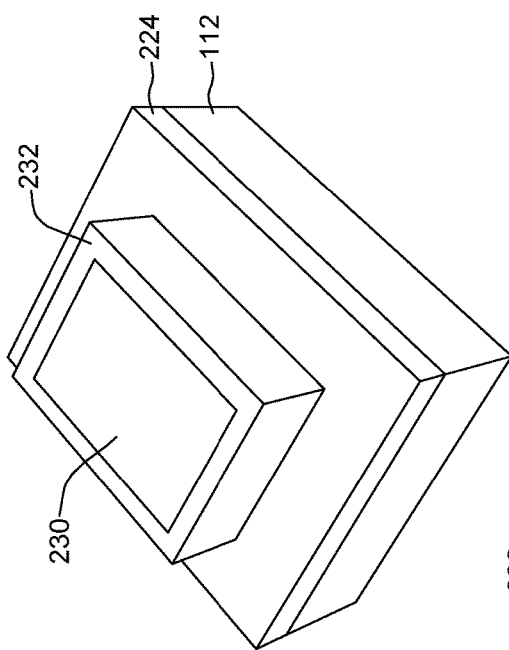
FIGS. 11-15 show perspective views of a preliminary structure undergoing a method to form a long channel, U-shaped FinFET according to embodiments of the disclosure.
Figure 13:
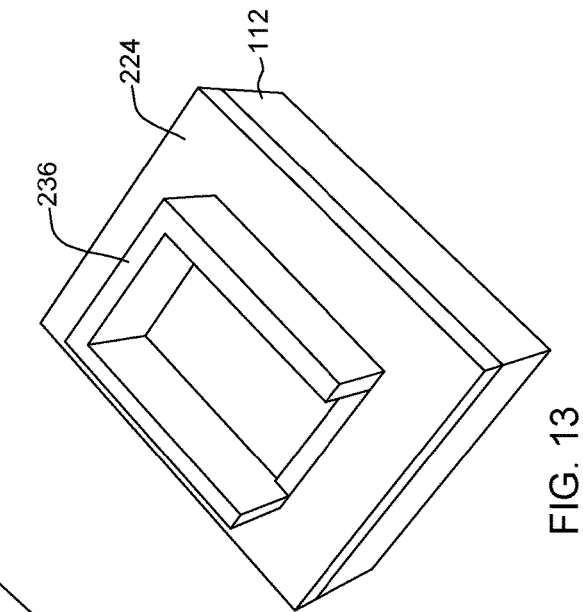

FIG. 8 shows a perspective view of FinFET 102 of FIGS. 6A-B. FIGS. 9-10 show perspective views of alternative embodiments of FinFET 102 of FIGS. 6A-B. FIG. 9 shows that additional contacts 180 may be made to source/drain regions 142, 144, i.e., on both sides of semiconductor fin 122L. FIGS. 9 and 10 also show other embodiments of FinFET 102 in which gate 160 extends laterally beyond an outer edge 194 of at least one of first source/drain region 142 and second source/drain region 144 (142 in FIG. 9 or 144 in FIG. 10, but could be both). It is understood that gate 160 would be supported underneath by other material, e.g., an STI (not shown).

Figure 12:
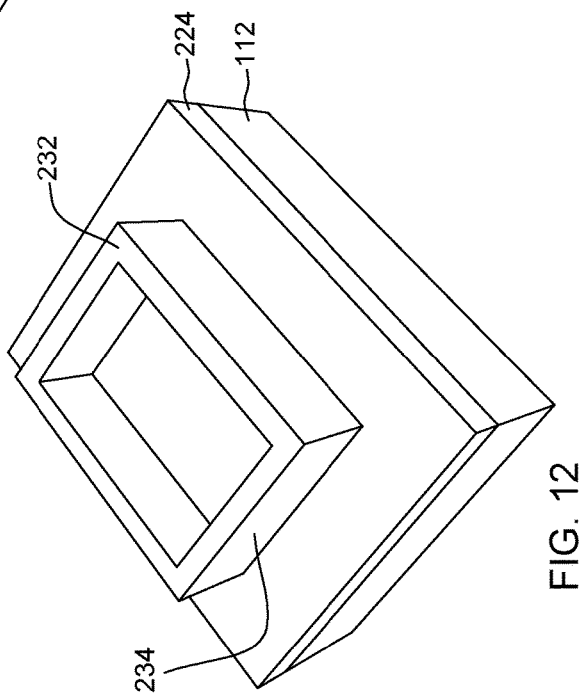
Figure 14:
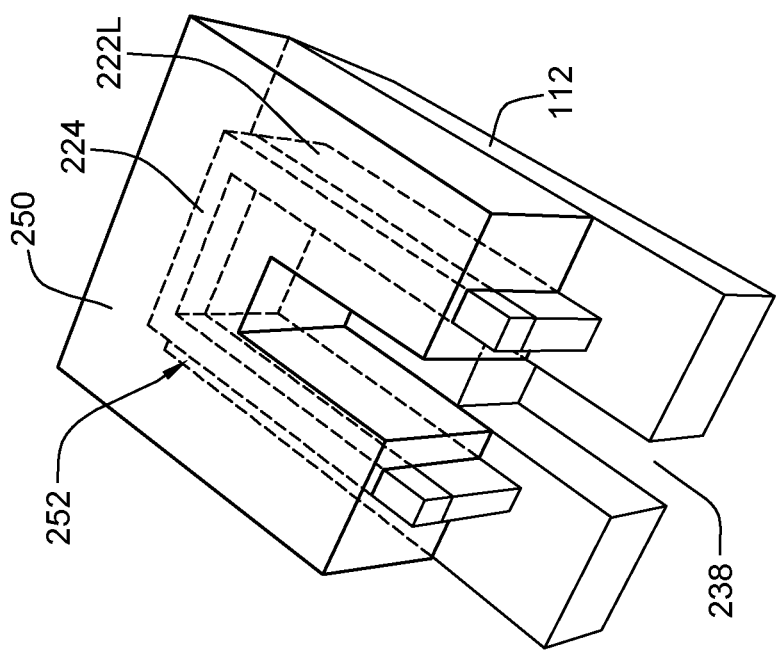

Referring to FIGS. 11-16, in another embodiment, a semiconductor fin 222L for a long channel FinFET 202 (FIG. 16) may be formed in a U-shape. In this embodiment, as shown in FIGS. 11-14, semiconductor fin 222L may be formed by creating a mandrel 230 over a hard mask layer 224. Hard mask layer 224 may be of the same material as mask 124, and extends over semiconductor substrate 112. Mandrel 230 may be made of any now known or later developed sacrificial material, e.g., amorphous polysilicon. A spacer 232 may be formed about mandrel 230. Spacer 232 may be made of any now known or later developed spacer material, e.g., silicon nitride. As shown in FIG. 12, mandrel 230 (FIG. 11) may be removed from within spacer 232, e.g., using any appropriate etching chemistry for the mandrel material. Spacer 232 is then polygonal, e.g., rectangular, and hollow inside. A portion 234 of spacer 232 can then be removed, e.g., using a mask and etching chemistry appropriate for the spacer material, creating a U-shaped mask 236 from spacer 232. As shown in FIG. 14, U-shaped mask 236 (FIG. 13) can be used to form U-shaped semiconductor fin 222L, including U-shaped mask 224 thereover. The etching may also create a U-shape in semiconductor substrate 112 including an open area 238. The etching may include any appropriate etching chemistry(ies) for mask 224 and semiconductor substrate 112.

Figure 15:
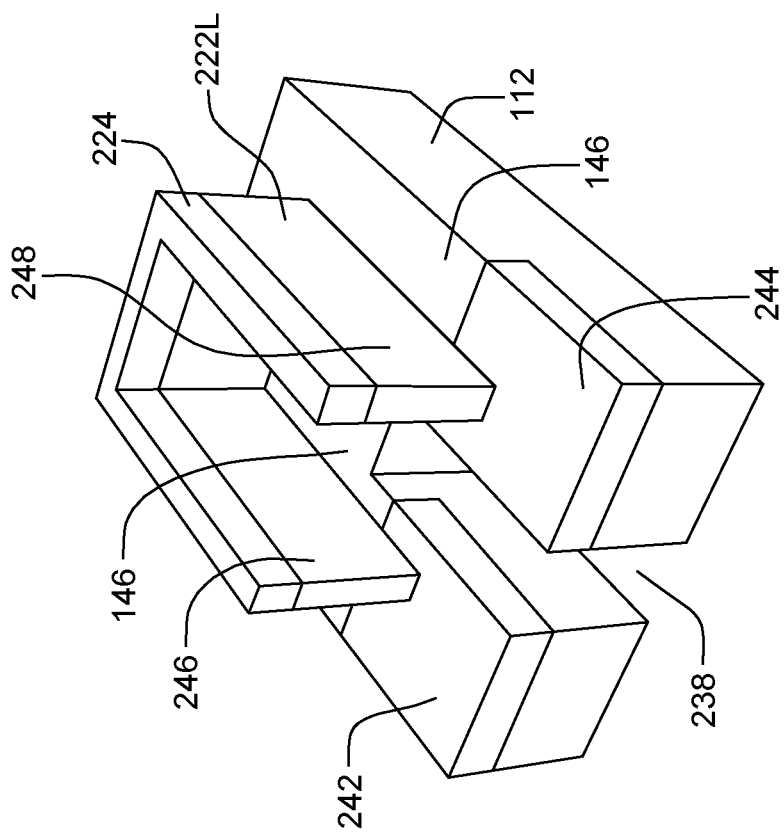
Figure 16:
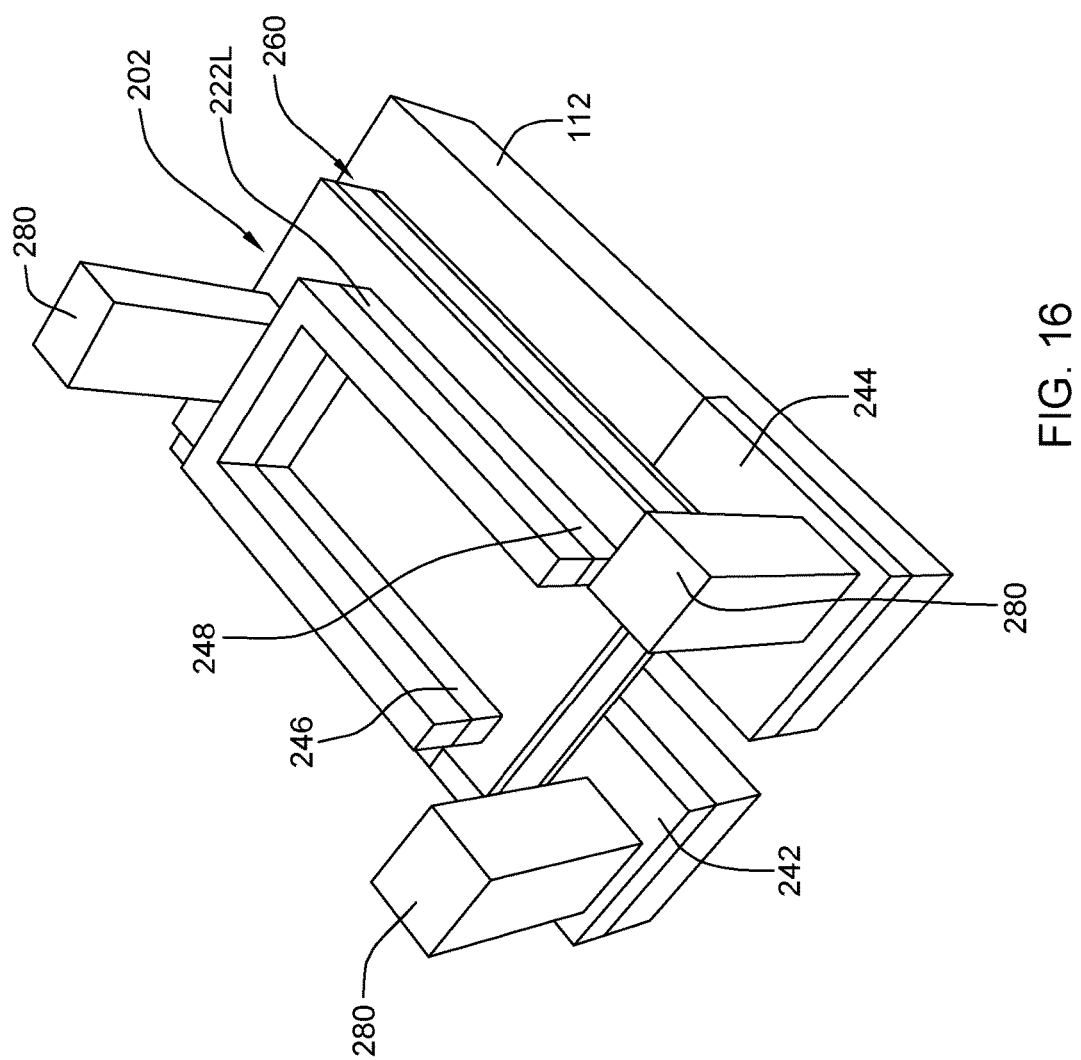
FIG. 16 shows a perspective view of a long channel, U-shaped FinFET according to an embodiment of the disclosure.

FIG. 15 shows the results of forming first and second source/drain regions 242, 244 to extend under respective first and second opposing ends 246, 248 of U-shaped semiconductor fin 222L. First and second source/drain regions 242, 244 may be formed by, as shown in phantom in FIG. 14, forming a mask 250 covering a bight portion 252 of U-shaped semiconductor fin 222L, and doping, as previously described herein. A portion 146 having an opposite doping from that of first and second source/drain region 242, 244 in substrate 112 separates first and second source/drain regions 242, 244. Portion 146 may have a rectangular shape and extend under fin 222L or it may be U-shaped. FIG. 16 shows a perspective view (without an ILD layer) of formation of a surrounding gate 260 and contacts 280 to form long channel, U-shaped FinFET 202. Surrounding gate 260 and contacts 280 are formed substantially similar to surrounding gate 160 and contact 180 (FIGS. 6A-B). As observed, a U-shaped FinFET 202 provides the ability to control channel length, i.e., through fin 222L between first and second source/drain regions 242, 244, and provide a channel length greater than may be available in a linear semiconductor fin 122L (FIGS. 6A-B).

Embodiments of an IC 100 provide a long channel FinFET 102, 202 with or without vertical FinFET 104 that does not require excessive height compared to vertical FinFETs. The methodology also does not require an extra mask step because lower spacer 162 does not need to be removed. Formation of source/drain regions uses an expanded portion of a mask (130, 250) that is already in use in other areas of the structure, but now also covers center portion 134 or bight portion 252 of semiconductor fin 122L, 222L for doping source/drain regions. Accordingly, no additional mask layers are required. Channel regions 190 have good surface roughness, and there is no need for a corner channel. In addition, gate and channel length control are improved compared to conventional processing, as is reliability.

The methods as described above are used in the fabrication of integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC), comprising:
   a first transistor structure including:
   a semiconductor substrate;
   a semiconductor fin extending from the semiconductor substrate;
   a doped first source/drain region in the semiconductor substrate under a first end of the semiconductor fin;
   a doped second source/drain region in the semiconductor substrate under a second, opposing end of the semiconductor fin, the second source/drain region separated from the first source/drain region by a portion of the semiconductor substrate having an opposite doping from that of the first and second source/drain region; and
   a surrounding gate extending about the semiconductor fin above the semiconductor substrate, a lower surface of the surrounding gate isolated from the semiconductor substrate by a first spacer.

2. The IC of claim 1, wherein the semiconductor fin includes a plurality of semiconductor fins, wherein the first and second doped source/drain regions extend under respective first and second opposing ends of each semiconductor fin, and the surrounding gate extends about each fin.

3. The IC of claim 1, wherein the semiconductor fin has a U-shape.

4. The IC of claim 1, further comprising at least one contact to each of the first source/drain region, the second source/drain region and the surrounding gate.

5. The IC of claim 1, wherein the semiconductor fin is devoid of dopants of the first and second source/drain regions.

6. The IC of claim 1, further comprising a second spacer over the surrounding gate, isolating an upper surface of the surrounding gate from other structure.

7. The IC of claim 1, further comprising a hard mask layer over an upper surface of the semiconductor fin.

8. The IC of claim 1, wherein the gate extends laterally beyond an outer edge of at least one of the first source/drain region and the second source/drain region.

9. The IC of claim 1, further comprising a second transistor structure, the second transistor structure including a vertical fin-type field effect transistor on the semiconductor substrate, and wherein the first transistor structure has a longer channel length than the second transistor structure.

* * * * *